United States Patent
Chou

(10) Patent No.: US 6,800,802 B2
(45) Date of Patent: Oct. 5, 2004

(54) CIRCUIT DEVICE FOR SOLAR ENERGY APPLICATION

(75) Inventor: Tao-Hung Chou, Pan-Chiao (TW)

(73) Assignee: Novaest Optitronix Inc., Taipei (TW)

( * ) Notice: Subject to any disclaimer, the term of this patent is extended or adjusted under 35 U.S.C. 154(b) by 0 days.

(21) Appl. No.: 10/290,608

(22) Filed: Nov. 9, 2002

(65) Prior Publication Data

US 2004/0089337 A1 May 13, 2004

(51) Int. Cl.[7] .......................... H01L 31/042; H02J 7/35
(52) U.S. Cl. ..................... 136/293; 136/244; 307/127; 307/51; 307/116; 361/82; 361/84; 320/101; 323/906; 323/221
(58) Field of Search ................................ 136/244, 293; 307/127, 51, 116; 361/82, 84; 320/101; 323/906, 221

(56) References Cited

U.S. PATENT DOCUMENTS

| 5,500,055 | A | * | 3/1996 | Toyama et al. ............. 136/259 |
| 5,714,869 | A | * | 2/1998 | Tamechika et al. .......... 320/101 |
| 5,726,505 | A | * | 3/1998 | Yamada et al. .............. 307/127 |
| 6,014,077 | A | * | 1/2000 | Beaumont et al. ........ 340/545.1 |
| 2001/0004198 | A1 | * | 6/2001 | Matsuyama .................. 320/101 |
| 2004/0051145 | A1 | * | 3/2004 | Nobe et al. .................. 257/355 |

FOREIGN PATENT DOCUMENTS

| EP | 891038 A1 | * | 1/1999 |
| JP | 8-84442 A | * | 3/1996 |

* cited by examiner

Primary Examiner—Alan Diamond

(57) ABSTRACT

A circuit device for solar energy application includes a solar panel as power supply and a rechargeable cell pack for receiving the power transferred from the solar panel. The circuit device uses a MOSFET as a current blocking device. The Drain and the Source of the MOSFET are conductively connected directly with the solar panel and the cell pack respectively so that the body diode of the MOSFET is forward interposed between the solar panel and the cell pack for prevention of a reverse current when charging is stopped.

9 Claims, 6 Drawing Sheets

CIRCUIT DEVICE FOR SOLAR ENERGY APPLICATION

FIELD OF THE INVENTION

This invention relates generally to a circuit device, particularly to an improved circuit device for solar energy application, in which a MOSFET (Metal-oxide-semiconductor-field-effect-transistor) is adopted to serve for a current-blocking device.

BACKGROUND OF THE INVENTION

FIG. 1 shows am embodiment of a current-blocking device in mechanical style, in which the current of a rechargeable cell pack 20 could be prevented from flowing back to a solar panel 10 when a switch 30 is switched "OFF" manipulatively. However, charging of the cell pack 20 can not be made automatically. It can be done only when the switch 30 is switched "ON" by hand.

Similarly, a diode 40 shown in FIG. 2 is another example for blocking current, in which the current of the cell pack 20 is prohibited from flowing back to the solar panel 10 through the diode 40. However, the solar panel 10 might not be able to transfer full energy to the cell pack 20 because of the considerable energy consumption of this diode 40.

In view of the above drawbacks in the conventional current blocking devices this invention is intended to propose an improved current-blocking device working between the rechargeable cell pack and the solar panel with infinitesimal power consumption.

SUMMARY OF THE INVENTION

The primary objective of this invention is to provide a current-blocking device between a solar panel and a rechargeable cell pack to serve for a current choker with little power consumption.

In order to achieve the above goal, an improved circuit device for solar energy application of this invention is comprised of a solar panel as power supply and a rechargeable cell pack for receiving the power transferred from that solar panel. Such an architecture has the characteristics that the Drain and the Source of a MOSFET are conductively connected with the solar panel and the cell pack respectively so that the body diode of the MOSFET Is forward interposed between the solar panel and the cell pack for prevention of a reverse current when charging is stopped.

For more detailed information regarding advantages or features of this invention, at least an example of preferred embodiment will be fully described below with reference to the annexed drawings.

BRIEF DESCRIPTION OF THE DRAWINGS

The related drawings in connection with the detailed description of this invention to be made later are described briefly as follows, in which.

DETAILED DESCRIPTION OF THE INVENTION

Figure 1:
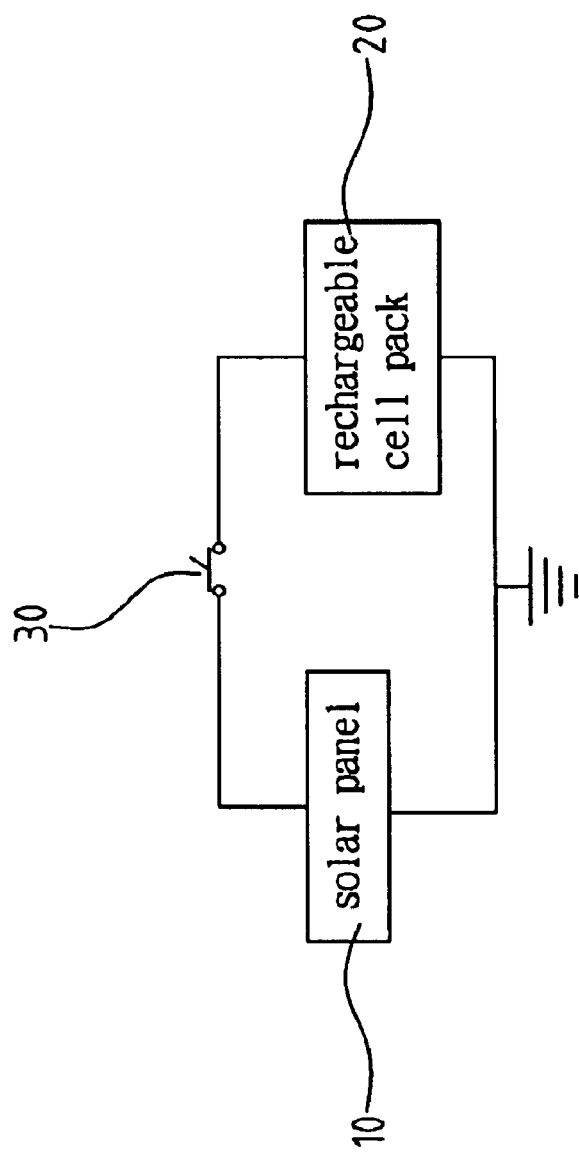
FIG. 1 shows a schematic current-blocking device in mechanical style.
Figure 2:
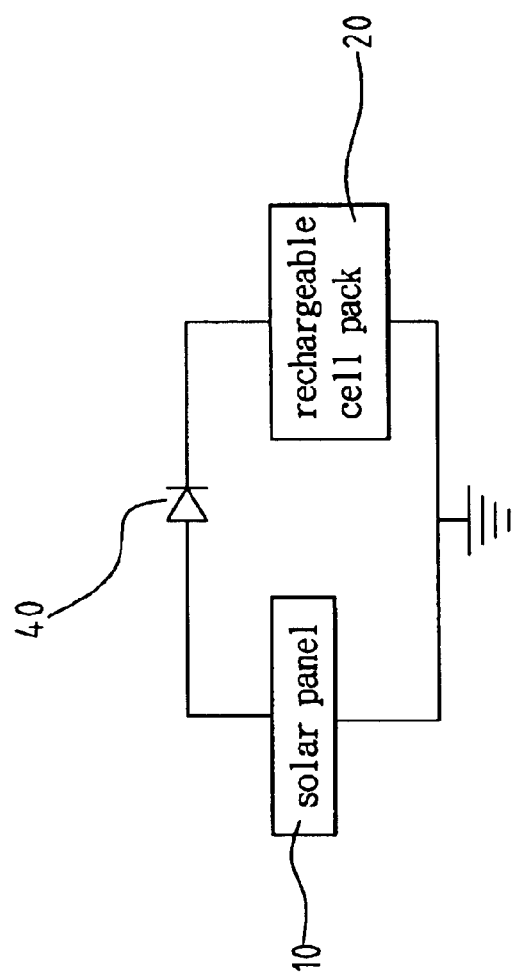
FIG. 2 shows a schematic diode serving as a current-blocking device.
Figure 3:
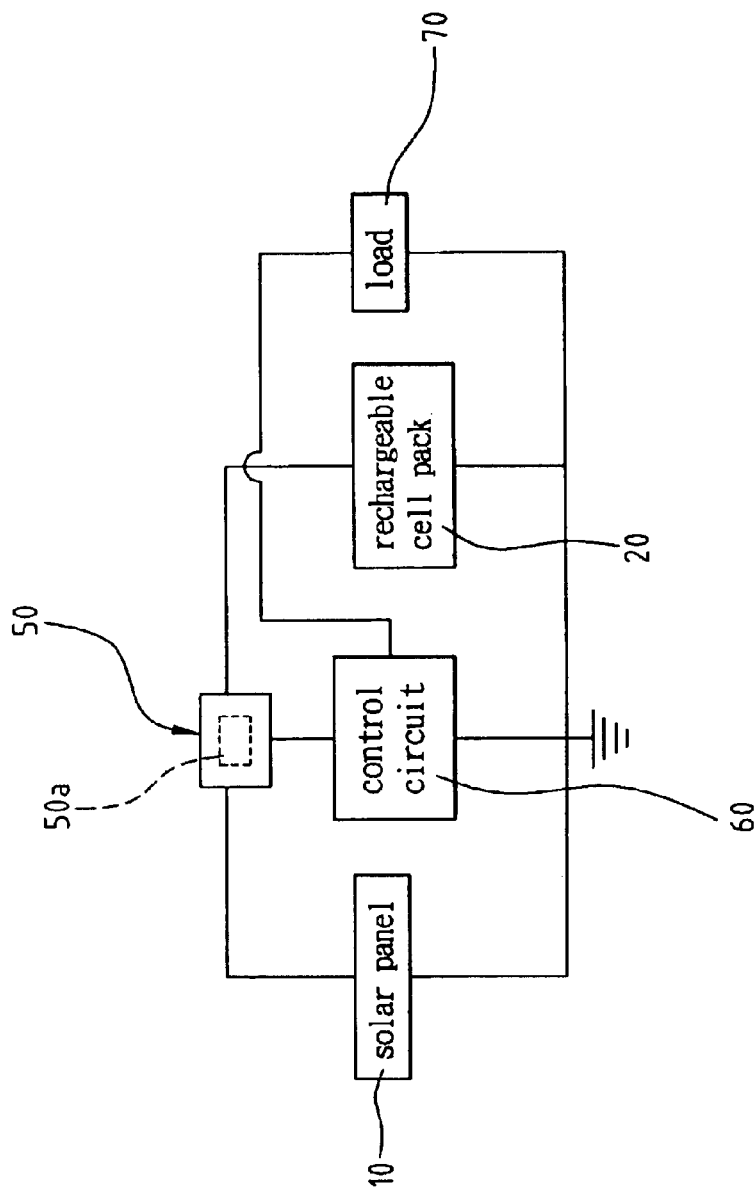
FIG. 3 shows a circuitry structure of this invention.

As indicated in a circuitry structure of this invention shown in FIG. 3, an improved circuit device for solar energy application comprises a solar panel 10 powered by the solar energy, a rechargeable cell pack 20 for receiving power provided by the solar panel 10, and a MOSFET (Metal-oxide-semiconductor-field effect-transistor) 50 of extreme importance connected conductively between the solar panel 10 and the cell pack 20 for prevention of reverse current flow from the cell pack 20 to the solar panel 10 when charging is unnecessary. The reverse current flow is prohibited because of the diode characteristics of a body diode 50a of the MOSFET 50.

The body diode 50a of the MOSFET 50 is forward connected between the solar panel 10 and the cell pack 20, in a way quite different from the usual connection manner, so that the reverse current flow from the cell pack 20 to the solar panel is forbidden. An example is given hereunder for exemplifying the function of this invention.

In the event that the cell pack 20 shown in FIG. 3 is a 1.2V NiCd rechargeable cell pack, the required voltage of the paired solar panel 10 would be 1.44V or up, which is further raised to reach 1.84V at least when the known barrier voltage of a generic schottky diode (about 0.4V) is counted. However, when a MOSFET 50 is employed for blocking current only 1.44V is needed as a satisfactory voltage which consumes 0.4 mW at an energy-saving rate of 21.73% ((1.84−1.44/1.84) for saving more than one-fifth of the power consumption and cost of the expensive solar panel 10 accordingly.

Figure 4:
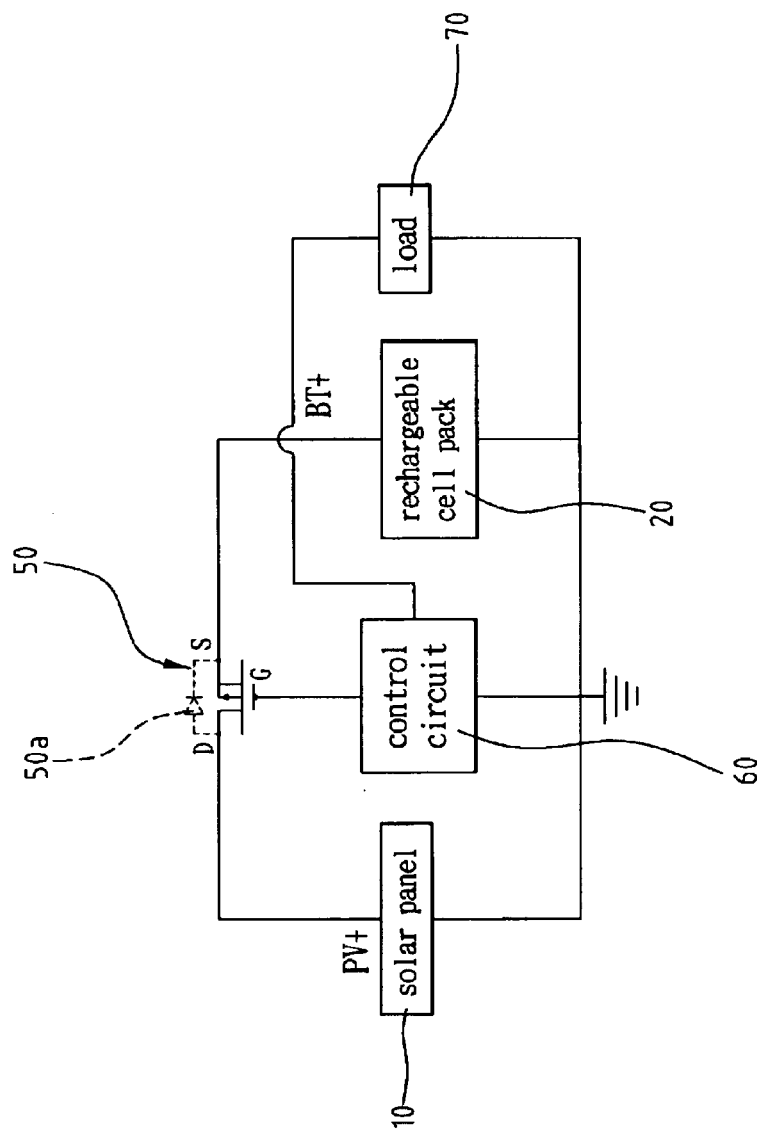
FIG. 4 shows that the circuitry structure of FIG. 3 is embodied on a P-MOSFET.
Figure 5:
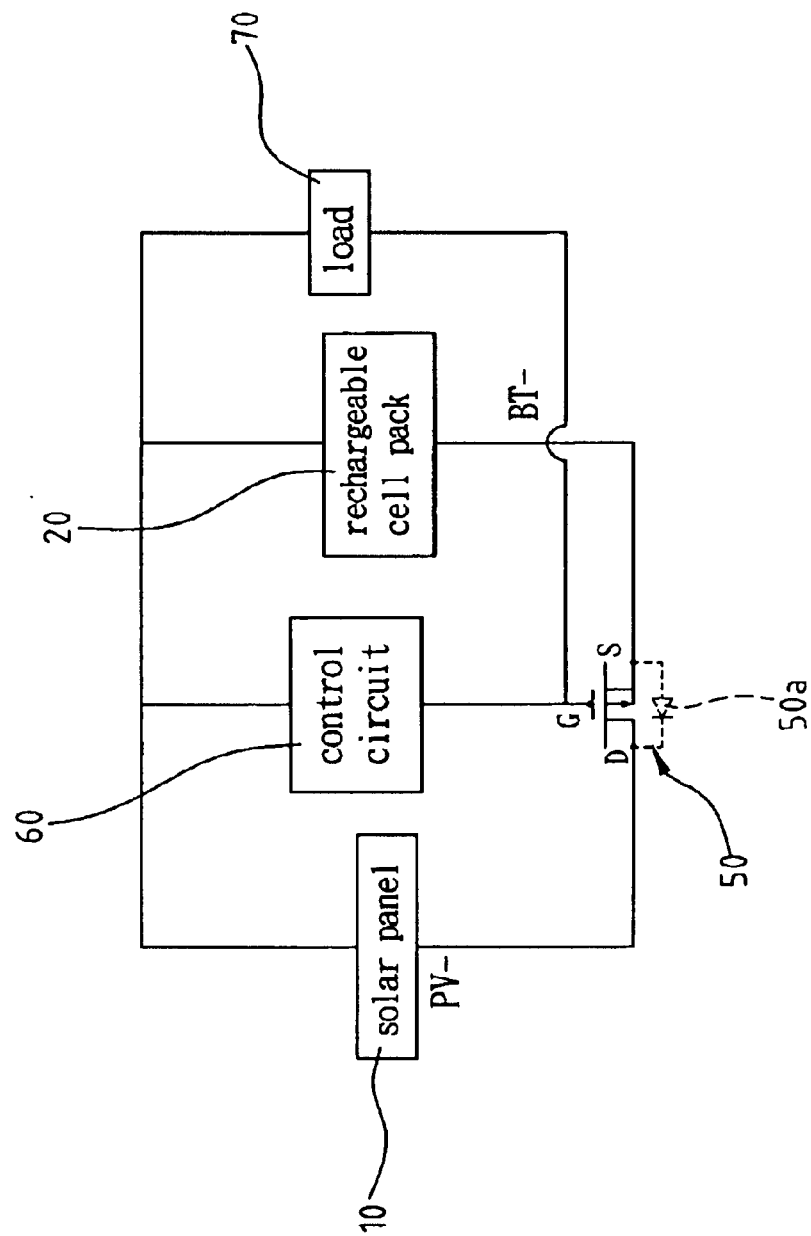
FIG. 5 shows that the circuitry structure of FIG. 3 is embodied on a N-MOSFET.

In FIG. 4, the Drain and the Source of a p-MOSFET 50 are connected to the positive end (PV+) of the solar panel 10 and the positive end (BT+) of the cell pack 20, respectively. In FIG. 5, the Drain and the Source of a n-MOSFET 50 are connected to the negative end (PV−) of the solar panel 10 and the negative end (BT−) of the cell pack 20, respectively. Obviously, the connection of the body diode of whatever a p-channel or an n-channel MOSFET is made forward between the solar panel 10 and the cell pack 20.

This invention further comprises a control circuit 60 connected conductively with the Gate of the MOSFET 50. When the control circuit 60 biases a forward voltage upon the MOSFET 50, the latter will consumes a relatively low power while the solar panel 10 is charging the cell pack 20.

A load 70 which could be a light fixture, lamp, or LED, etc. might be connected to the control circuit 60.

Figure 6:
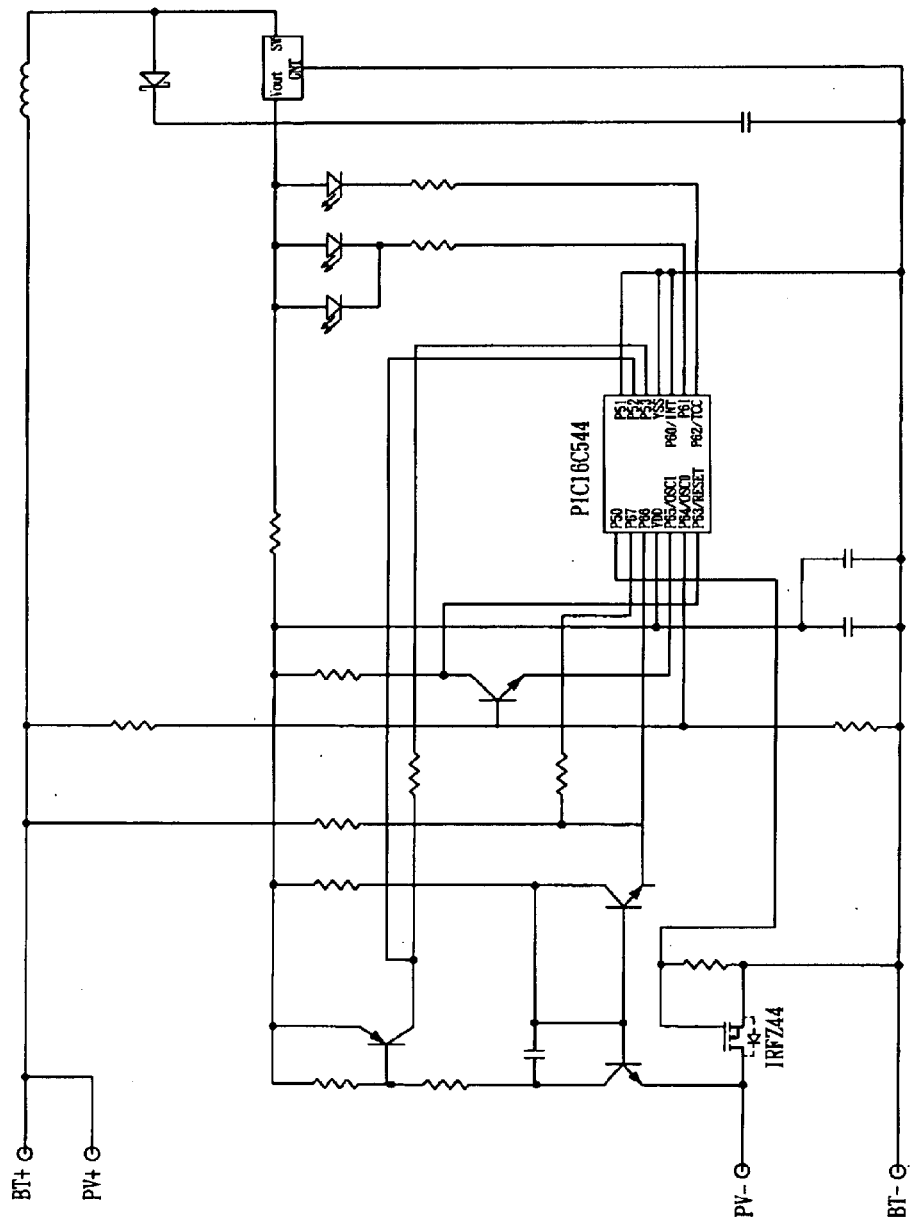
FIG. 6 shows the circuit of FIG. 3 in details.

In an application example shown in FIG. 6, the control circuit 60 is formed as an integrating circuit PIC16C544, one pin thereof is connected to the Gate of the MOSFET IRFZ44 for biasing a voltage.

In the above specification, at least one preferred embodiment has been described in detail with reference to the drawings annexed, and it is apparent that numerous changes or modifications may be made without departing from the true spirit and scope thereof, as set forth in the claims below.

What is claimed is:

1. A circuit device for solar energy application, which is comprised of a solar panel for power supply and a rechargeable cell pack for receiving the power transferred from said solar panel, said circuit device comprising:

a MOSFET (Metal-oxide-semiconductor-field-effect-transistor) having a Drain connected directly to said solar panel and a Source conductively connected with said cell pack;

wherein a body diode of the MOSFET is forward interposed between said solar panel and said cell pack in a manner for prevention of a reverse current when charging is stopped.

2. The circuit device according to claim 1, wherein said rechargeable cell pack is a NiCd cell pack.

3. The circuit device according to claim 2, wherein said NiCd cell pack has a voltage of 1.2V.

4. The circuit device according to claim 3, wherein said solar panel has a voltage of 1.44V.

5. The circuit device according to claim 1, wherein said MOSFET is a p-MOSFET with its Drain and Source connected to a positive end of said solar panel and a positive end of said cell pack respectively.

6. The circuit device according to claim 1, wherein said MOSFET is a n-MOSFET with its Drain and Source connected to a negative end of said solar panel and a negative end of said cell pack respectively.

7. The circuit device according to claim 1, further comprising a control circuit conductively connected to said MOSFET.

8. The circuit device according to claim 7, wherein said control circuit is connected to a Gate of said MOSFET for biasing a voltage and thereby saving power consumption of the MOSFET.

9. The circuit device according to claim 7, wherein said control circuit is connected to a load.

* * * * *